(12) United States Patent
Greco

(10) Patent No.: US 11,740,451 B2
(45) Date of Patent: Aug. 29, 2023

(54) PROJECTOR COLOR WHEEL AND PROJECTOR ILLUMINATION DEVICE

(71) Applicant: Sony Group Corporation, Tokyo (JP)

(72) Inventor: Tonino Greco, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 23 days.

(21) Appl. No.: 17/368,830

(22) Filed: Jul. 7, 2021

(65) Prior Publication Data
US 2022/0019074 A1  Jan. 20, 2022

(30) Foreign Application Priority Data

Jul. 14, 2020 (EP) .................... 20185782

(51) Int. Cl.
G02B 26/00 (2006.01)
G03B 21/20 (2006.01)
H01L 33/06 (2010.01)
H01L 33/50 (2010.01)

(52) U.S. Cl.
CPC ......... G02B 26/008 (2013.01); G03B 21/204 (2013.01); H01L 33/06 (2013.01); H01L 33/504 (2013.01); H01L 33/507 (2013.01)

(58) Field of Classification Search
CPC ...... H01L 33/06; H01L 33/504; H01L 33/507
See application file for complete search history.

(56) References Cited

U.S. PATENT DOCUMENTS

| 2017/0023188 | A1* | 1/2017 | Mima | ............... C09K 11/02 |
| 2018/0072949 | A1* | 3/2018 | Satake | ............... G02B 5/20 |
| 2018/0187070 | A1 | 7/2018 | Chou et al. | |
| 2018/0299755 | A1 | 10/2018 | Chou et al. | |
| 2019/0011819 | A1 | 1/2019 | Chou et al. | |
| 2019/0097722 | A1 | 3/2019 | McLaurin et al. | |
| 2019/0211259 | A1* | 7/2019 | Khalil | ............... C09K 11/025 |
| 2020/0176644 | A1* | 6/2020 | Nagasaki | ............... C09K 11/70 |
| 2020/0201207 | A1* | 6/2020 | Sato | ............... G03G 15/0879 |
| 2020/0218309 | A1* | 7/2020 | Oh | ............... G02F 1/135 |
| 2021/0270428 | A1* | 9/2021 | Ueda | ............... F21K 9/64 |

FOREIGN PATENT DOCUMENTS

| CN | 104020632 A | 9/2014 |
| WO | 2014/053951 A1 | 4/2014 |

* cited by examiner

Primary Examiner — Mark W Tornow
(74) Attorney, Agent, or Firm — Xsensus LLP

(57) ABSTRACT

A projector color wheel, including:
a substrate;
a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents;
a second film for changing a wavelength of light, provided on the substrate, including a second material, the second material being configured to emit light according to a second emission profile with at least a second emission peak at a second emission wavelength when light of the predetermined wavelength incidents;
wherein each of the first film and the second film includes a binding material; and
wherein the first emission wavelength is larger than the second emission wavelength.

20 Claims, 4 Drawing Sheets

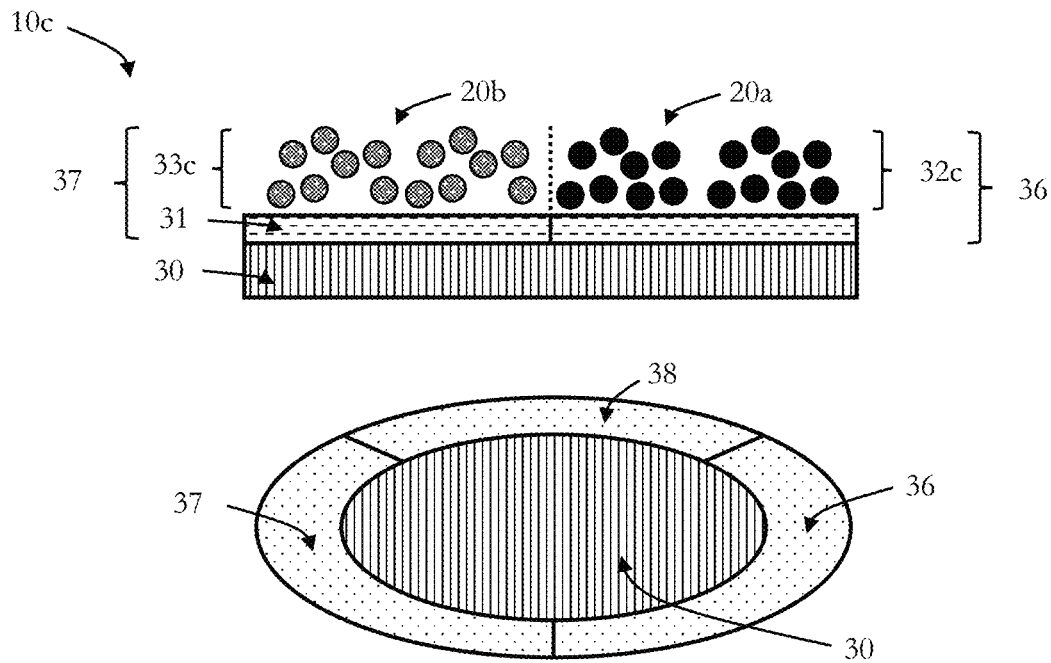

Providing a first film for changing a wavelength of light on a substrate, including a first material including a plurality of first quantum dots of a first quantum dot type, the plurality of first quantum dots being configured to emit light according to a first emission profile with at least a first emission peak at a first emission wavelength when light of a predetermined wavelength incidents 101

Providing a second film for changing a wavelength of light on the substrate, including a second material, the second material being configured to emit light according to a second emission profile with at least a second emission peak at a second emission wavelength when light of the predetermined wavelength incidents 102

Fig. 8

PROJECTOR COLOR WHEEL AND PROJECTOR ILLUMINATION DEVICE

CROSS-REFERENCE TO RELATED APPLICATION

This application claims priority from EP 20185782.8, filed on Jul. 14, 2020, the entire contents of which are incorporated herein by reference.

TECHNICAL FIELD

The present disclosure generally pertains to a projector color wheel and a projector illumination device.

TECHNICAL BACKGROUND

In recent years laser illuminated projectors became available which generally use one of two basic technologies. One approach is to directly use separate light sources such as, for example, a red, a green and a blue laser diode to illuminate three imagers, such as transmissive micro-LCDs (Liquid Crystal Display) or DLP (Digital Light Processing) chips.

Another technology uses, for example, blue laser diodes to provide the blue light and to excite a phosphor to emit e.g. yellow light, which can be separated into red and green light components. This technology is typically called blue laser-pumped phosphor (BPP) or laser hybrid.

Additionally, laser diodes when used, for example, in laser illuminated projectors, can provide a range of color gamuts. However, generally, laser diodes emit light in a very narrow spectral range, i.e. wavelength range, which can be considered as almost a single wavelength. Typically, this is useful for the BT.2020 color gamut, whose primaries are single wavelengths, however, this may also result in speckling, an artifact that imparts a grainy look to the image (and not in a good "film grain-like" way).

In comparison to, for example, xenon lamps used in some current commercial projectors, laser diodes have other technical characteristics. One characteristic is the longevity, since, typically, laser diodes can have an effective lifetime of about 10,000 to 100,000 hours with little decline in brightness per hour of use, whereas some xenon lamps have a lifetime of about 500 to 1,000 hours. Another difference between laser diodes and xenon lamps is the efficiency in converting electrical power to light output i.e. optical power. Generally, laser diodes can generate about 5-6 lumen per watt from the wall on which the light incidents, while xenon lamps typically generate 2-5 lumen per watt. Thus, in some cases, laser illuminated projectors can reduce power consumption by about 30-50% compared to lamp-based models.

There exist known phosphor-based laser illuminated projectors which only use blue laser diodes as a primary light source, since they are comparable cheap and widespread due to their use in, for example, Blu-Ray players. The light beam emitted by a blue laser diode module can be combined with a yellow light beam created by, for example, the emission of the light generated by a second blue laser diode module on e.g. a projector color wheel which has a yellow phosphor layer for color generation. The mix of these two light beams creates a white light beam sent to the light engine via the integrator rod. The picture can then be created using the same process as, for example, in a xenon-based projector.

Typically, a projector color wheel, includes a rotating disk and a wavelength-changing layer by means of a plate and a phosphor layer disposed on the plate. However, for example, a yellow phosphor compound has typically certain characteristics regarding the color gamut and the fluorescence lifetime.

Although there exist techniques for a projector color wheel and a projector illumination device, it is generally desirable to improve the existing techniques.

SUMMARY

According to a first aspect the disclosure provides a projector color wheel, comprising:
a substrate;
a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents;
a second film for changing a wavelength of light, provided on the substrate, including a second material, the second material being configured to emit light according to a second emission profile with at least a second emission peak at a second emission wavelength when light of the predetermined wavelength incidents;
wherein each of the first film and the second film includes a binding material; and
wherein the first emission wavelength is larger than the second emission wavelength.

According to a second aspect the disclosure provides a projector illumination device, comprising:
a light source configured to emit light of at least a predetermined wavelength; and
a projector color wheel, including:
a substrate;
a first film for a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents; a second film for changing a wavelength of light, provided on the substrate, including
a second material, the second material being configured to emit light according to a second emission profile with at least a second emission peak at a second emission wavelength when light of the predetermined wavelength incidents;
wherein each of the first film and the second film includes a binding material; and
wherein the first emission wavelength is larger than the second emission wavelength.

Further aspects are set forth in the dependent claims, the following description and the drawings.

BRIEF DESCRIPTION OF THE DRAWINGS

Embodiments are explained by way of example with respect to the accompanying drawings, in which.

FIG. 7 schematically illustrates a third embodiment of a projector color wheel; and FIG. 8 schematically illustrates in a flow diagram a method of manufacturing of a projector color wheel.

DETAILED DESCRIPTION OF EMBODIMENTS

Figure 3:
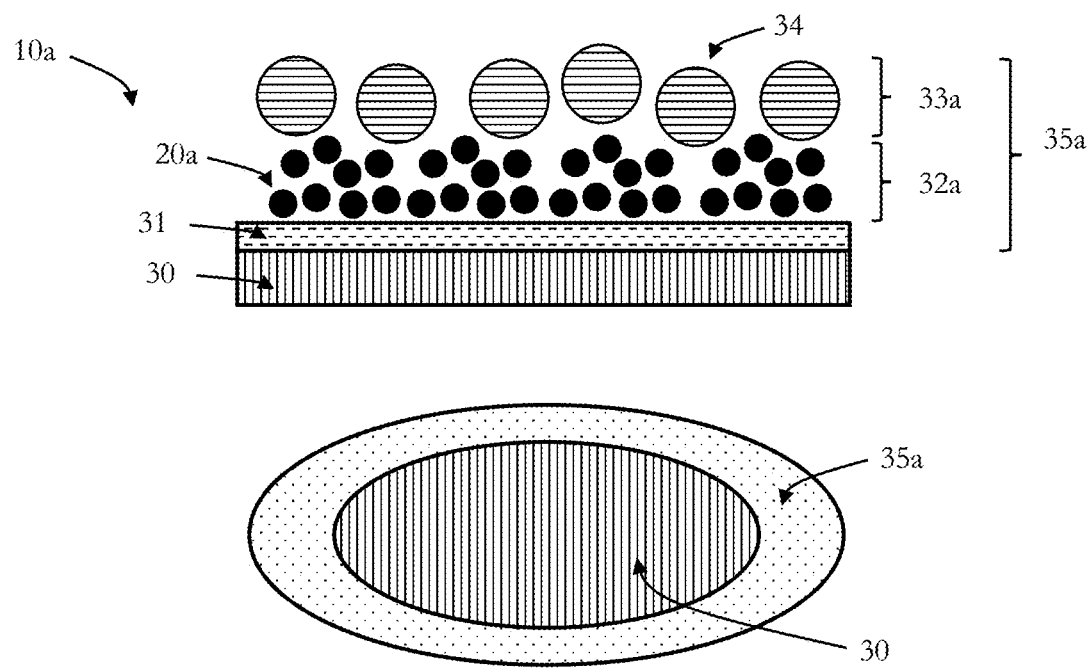
FIG. 3 schematically illustrates a first embodiment of a projector color wheel.

Before a detailed description of the embodiments under reference of FIG. 3 is given, general explanations are made.

As mentioned in the outset, a known technology in laser illuminated projectors uses, for example, blue laser diodes to provide the blue light and to excite a phosphor to emit e.g. yellow light, which can be separated into red and green light components. When using such a phosphor compound on a projector color wheel with blue laser diodes as the primary light source, the necessary red, blue and green colors, are generated by the blue light from the laser diodes when incident onto the spinning wheel, i.e. the rotating projector color wheel coated with the phosphor compound. The laser light excites the phosphor and generates, for example, yellow light. The yellow light may be split into red and green using, for example, a dichroic filter while the blue light passes directly through a diffusion segment in the phosphor wheel. The picture or image can then be created using the same process as, for example, in a xenon-based projector.

However, it has been recognized that the use of, for example, a yellow phosphor compound may result, e.g., in a degraded color gamut and fluorescence lifetime. Typically, yellow phosphor shows a broad spectral emission (>100 nm) with little optical power in red spectral region, and it has been recognized that the fluorescence lifetime may be too long to be used in high power applications, since a saturation of the excited states may occur.

Generally, quantum dots are known, which are, in some embodiments, semiconductor particles in the nanometer range having optical and electronic properties that differ from larger particles. In a quantum dot the motion of electrons and holes is confined by the bandgap structure of the semiconductor materials of which the quantum dot is composed leading to discrete electronic states. Typically, quantum dots manufactured by colloidal synthesis have an optically active core and a protective layer formed on the core. The electronic states and, thus, the optical absorption and emission properties (e.g. absorption band, emission profile, emission peaks and corresponding emission wavelengths) can be controlled, in some embodiments, by the size of the core part and the protective layer and their material composition.

It has been recognized that quantum dots, in some embodiments, having a narrow emission profile (<35 nm) and short fluorescence lifetime in the nanosecond time domain may be used in, for example, wavelength-changing applications such as in laser illuminated projectors.

Hence, some embodiments pertain to a projector color wheel, including:

a substrate;

a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents;

a second film for changing a wavelength of light, provided on the substrate, including a second material, the second material being configured to emit light according to a second emission profile with at least a second emission peak at a second emission wavelength when light of the predetermined wavelength incidents;

wherein each of the first film and the second film includes a binding material; and wherein the first emission wavelength is larger than the second emission wavelength.

The projector color wheel may be used in a laser illuminated projector for changing a wavelength of light without limiting embodiments to this case. When light of (at least) a predetermined wavelength incident onto the projector color wheel, such as light from blue laser diode with e.g. 450 nm, the projector color wheel functions as a wavelength-changer of (the incident) light. In other words, the blue light incident generates light in the first and the second film of wavelengths different from the incident light. The generated light can be used in the projector to generate an image projected onto a screen.

The projector color wheel may be a disk-shaped, flat cylindrical body or generally a flat rotation symmetrical body without limiting embodiments to this case, since the projector color wheel typically rotates in a laser illuminated projector. The projector color wheel may have a mount through an axis around which the body of the projector color wheel may be rotated.

The substrate may be made of a glass, a ceramic, a semiconductor, a metal, or the like, or a combination thereof. The substrate is basically a support material or support body on which a functional film is provided, wherein the functional film includes materials for changing a wavelength.

Generally, the projector color wheel may be used, as will be explained further below, in reflection (FIG. 1A), transmission (FIG. 1B) or a combination thereof (with respect to the incident light). The combination may be achieved by providing a first section on the projector color wheel in transmission and a second section in reflection, for example, by providing a reflective film only in a certain section on projector color wheel.

The first and second film for changing a wavelength of light are material layers provided on the substrate for changing or converting light of (at least) a predetermined wavelength incident onto the film, i.e. the material layer, by generating light of various wavelengths, e.g. a continuum of light in a material-dependent wavelength range. The first and the second film (at least partially) absorbs the incident light of the predetermined wavelength and emits, for example, (red-shifted) light, whereby the new wavelengths are generated from the incident light, which causes that a wavelength of light is (at least partially) changed. They may be arranged on each other or may be provided as separate sections on the substrate.

The first and second film may be provided by known methods on the substrate, for example, by screen printing or material deposition techniques or the like as generally known.

The first material includes a plurality of first quantum dots of a first quantum dot type. The first color-conversion material may further include a phosphor compound, another quantum dot type, residuals from production or the like.

In some embodiments, the first quantum dot type has a multi-shell, i.e. multi-layer, quantum dot structure of at least three layers (core layer, shelling layer and oxide layer) each layer including at least one of a number of possible quantum dot materials or oxides as will be discussed further below.

The plurality of first quantum dots of the first quantum dot type may be produced by known preparation methods for quantum dots such as colloid synthesis as generally known.

A brief introduction in the light absorption and emission process in semiconductor quantum dots is given in the following, which may be present in some embodiments. In semiconductor quantum dots, light absorption may lead to an electron being excited from the valence to the conduction band, leaving behind a hole. The electron and the hole, for example, can bind to each other to form an exciton. When this exciton recombines (i.e. the electron resumes its ground state), the exciton's energy may be emitted as light. Typically, this may be possible from a number of bounded exciton states such that a number of radiative transitions is possible. Moreover, other radiative transitions may be allowed in semiconductor quantum dots. Generally, each radiative transition is not restricted to a single wavelength due to broadening mechanisms such as at least natural broadening.

Hence, the probability that a certain wavelength is emitted (from a single quantum dot after absorption of incident light) may depend at least on the probability of the corresponding radiative transition of an electron and a hole and, thus, the optical power emitted by the plurality of quantum dots after excitation varies according to the emission profile in some embodiments. Accordingly, the emission profile may be understood as the integrated optical power recorded for a plurality of wavelengths in a wavelength range over a certain time interval, wherein the optical power is emitted by a plurality of quantum dots when light of (at least) a predetermined wavelength incident. In addition, production-related variations, for example, in the size of the quantum dots, may contribute to the emission profile and, accordingly, the emission profile may basically reflect an ensemble property of a plurality of quantum dots.

Typically, the emission profile of a material has at least one emission peak which may originate from the lowest radiative electronic state (optically allowed transition) and, as described above for the example of quantum dots, a continuum of wavelengths may be emitted, e.g. an emission peak, and each wavelength may be emitted with a certain probability. In some embodiments, the emission peak is present at a certain emission wavelength (e.g. a maximum of the peak, a certain wavelength in a wavelength interval characterizing the emission peak such as the full-width-at-half-maximum, or the like), which may correspond to the energy difference between the energy of the radiative state and the ground state (for example energy difference of the electron and hole state). In some embodiments, the emission wavelength corresponds to the wavelength at which a maximum of the emission peak is present (is recorded).

The second material may include or may be a phosphor compound or a plurality of second quantum dots of a second quantum dot type. The second material may further include (another) phosphor compound, (another) quantum dot type, residuals from production or the like. The phosphor compound may be cerium doped yttrium aluminum garnet (Ce:YAG; $Ce^{3+}:Y_3Al_5O_{12}$) or terbium and gadolinium instead of cerium, SiAlON phosphor, a $CaAlSiN_3$-based phosphor or the like.

Each of the first and the second film includes a binding material. In some embodiments, the binding material is used for attaching both films to each other. The binding material may be able to store heat which is generated during the wavelength-changing process.

The binding material may be sodium silicate ($Na_2SiO_3$). The binding material may be one of an aqueous solution of silicates having the general formula $M_2O*n\,SiO_2$, wherein M may be a cation of Lit, $Na^+$, $K^+$, and ammonium cations $NR_4^+$ with R being an H-atom, an alkyl group, an alkylene group or a combination thereof. The binding material may be a sodium aluminate ($Na_xAl_yO_z$) which can be obtained from aqueous alkaline aluminate solutions, for example, $NaAlO_2$ or $NaAl_{11}O_{17}$ (sodium-β-aluminate). The binding material may be a potassium aluminate, for example, $KAlO_2$, $K_3AlO_3$, $K_5AlO_4$, $K[Al(OH)_4]$ or $K_3[Al(OH)_6]$ (potassium hydroxy aluminate). The binding material may be an earth alkali fluoride ($MF_2$) or sulphate ($MSO_4$) or phosphate ($M_3PO_4$), wherein the M stands for one of Mg, Ca, Sr and Ba. The binding material may be an alkali yttrium fluoride ($MYF_4$ with M being one of K, Na and Li), an yttrium vanadate ($YVO_4$), a lanthanum vanadate ($LaVO_4$) or a yttrium borate ($YBO_3$).

The second material emits light according to a second emission profile with at least one emission peak at a second emission wavelength. The first material emits light according to a first emission profile with at least one emission peak at a first emission wavelength. The first emission wavelength is larger than the second emission wavelength.

For enhancing the overall understanding of the present disclosure, in the following, two basic embodiments of a projector illumination device are discussed under reference of FIGS. 1A and 1B, respectively, wherein the embodiment of FIG. 1A pertains to a reflective configuration and the embodiment of FIG. 1B pertains to a transmissive configuration.

Figure 1:
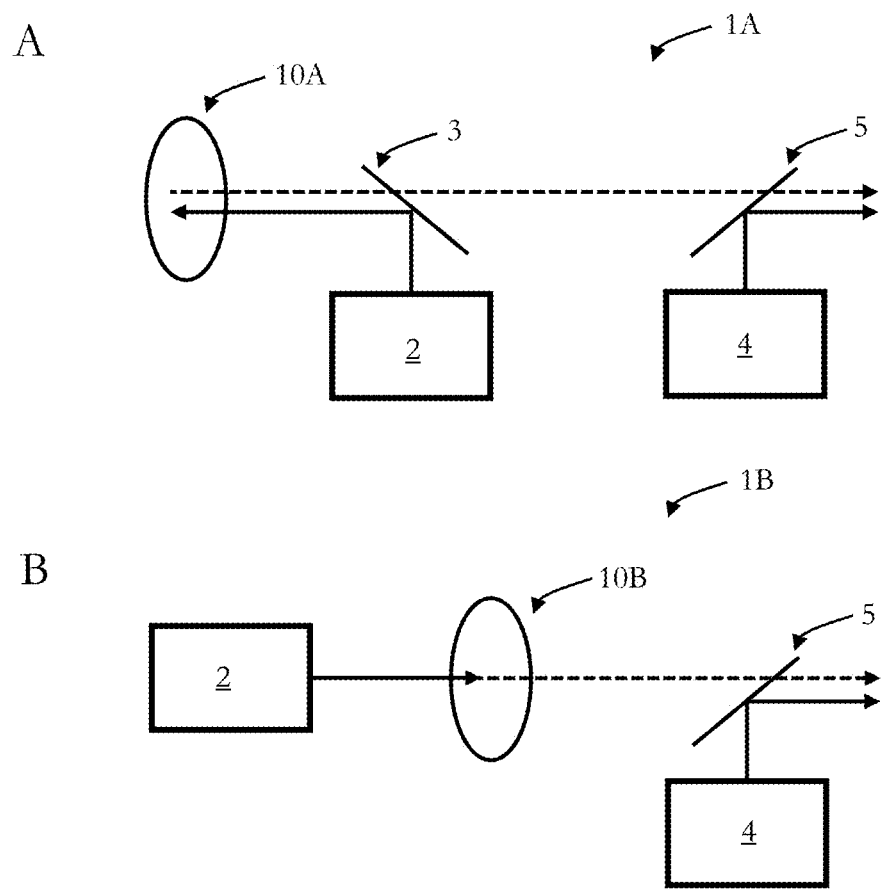
FIG. 1 schematically illustrates in a block diagram two embodiments of a projector illumination device.

FIG. 1A schematically illustrates in a block diagram an embodiment of a projector illumination device 1A which uses a projector color wheel 10A in reflective configuration. The embodiment is discussed under reference of FIG. 1A and FIG. 4.

Figure 4:
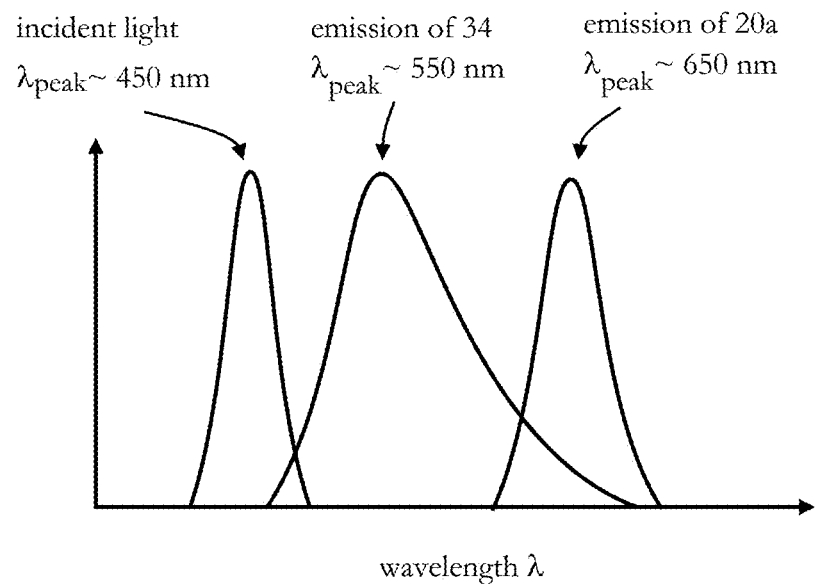
FIG. 4 schematically illustrates in a graph an embodiment of an optical output profile, a first emission profile with a first emission peak at a first emission wavelength of a first film and a second emission profile with a second emission peak at a second emission wavelength of a second film.

The projector illumination device 1A has a first light source 2, here a blue laser diode, emitting light including (at least) a predetermined wavelength of (about) 450 nm. The corresponding (spectral) optical output profile of the light source 2 is shown in FIG. 4 as the left graph.

The emitted blue light is reflected at a dichroitic mirror 3 and incidents (solid arrow) onto the projector color wheel 10A. The projector color wheel 10A may rotate (not shown), as it is generally known for color wheels.

A first and a second film for changing a wavelength of light is provided on the substrate of the projector color wheel 10A. Both films generate or emit light (dashed arrow) according to a first and a second emission profile with at least one emission peak at a first and a second emission wavelength, respectively, when light including (at least) the predetermined wavelength incident. The first emission wavelength is larger than the second emission wavelength.

The light emitted from the projector color wheel 10A passes the dichroitic mirror 3. This light is combined with light emitted from a second light source 4 by a dichroitic mirror 5 to be used in a subsequent image creation step.

The projector illumination device 10A is only illustrated schematically and may include other or further optical components for light steering and manipulation and it may not need to have a second light source.

FIG. 1B schematically illustrates in a block diagram an embodiment of a projector illumination device 1B which uses a projector color wheel 10B in transmissive configuration. The same reference signs as in FIG. 1A are used for components which have basically the same configuration and functionality. The embodiment is discussed under reference of FIG. 1B and FIG. 4.

The projector illumination device 1B has a first light source 2, here a blue laser diode, emitting light including (at least) a predetermined wavelength of (about) 450 nm. The corresponding (spectral) optical output profile of the light source 2 is shown in FIG. 4 as the left graph.

The emitted blue light incident (solid arrow) onto the projector color wheel 10A. The projector color wheel 10A may rotate (not shown), as it is generally known for color wheels.

A first and a second film for changing a wavelength of light is provided on the substrate of the projector color wheel 10B. Both films generate or emit light (dashed arrow) according to a first and a second emission profile with at least one emission peak at a first and a second emission wavelength, respectively, when light including (at least) the predetermined wavelength incident. The first emission wavelength is larger than the second emission wavelength.

The light emitted from the projector color wheel 10B passes a dichroitic mirror 5 where it is combined with light emitted from a second light source 4 to be used in a subsequent image creation process.

The projector illumination device 10B is only illustrated schematically and may include other or further optical components for light steering and manipulation and it may not need to have a second light source.

The embodiments of FIGS. 1A and 1B are basically illustrative embodiments of how a projector color wheel 10A or 10B is used in principle in an (projector) illumination device 1A or 1B, respectively.

The projector color wheel 10A or 10B may be any of the embodiments of a projector color wheel as described herein.

Returning to the general explanations, in some embodiments, the first and the second film are arranged on each other on the substrate. Generally, the order of the first and the second film on the substrate can be arbitrary, for example, the first film may be provided on the substrate having the second film on top or vice versa.

In some embodiments, the first and the second film are provided as separate sections on the substrate. In such embodiments, each film is provided on the substrate without having another film on top.

In some embodiments, the second material includes cerium doped yttrium aluminum garnet. The cerium doped yttrium aluminum garnet (Ce:YAG) is known to emit light according to a (broad) emission profile having an emission peak at a (yellow) emission wavelength of about 550 nm.

Accordingly, in some embodiments, on the substrate of the projector color wheel, a film including a plurality of first quantum dots of a first type and a film including a yellow phosphor, e.g. Ce:YAG, are provided. In such embodiments, the films may be arranged on each other or may be provided as separate sections on the substrate.

In some embodiments, where the films are arranged on each other, the Ce:YAG film is provided as the film on which the (excitation) light including (at least) the predetermined wavelength incidents at first in order to decrease the optical power incident to the plurality of first quantum dots. Since the yellow emission of the Ce:YAG film, which absorbed part of the excitation light, may also excite the quantum dots to generate the red light, the amount of generated heat may be reduced (excess energy is lower) as the quantum dots are excited in a lower energy state than with blue light, thereby the lifetime of the quantum dots may be increased and, thus, of the films and the projector color wheel.

In some embodiments, the second material includes a plurality of second quantum dots of a second quantum dot type. The second quantum dot type may have a multi-shell, i.e. multi-layer, quantum dot structure of at least three layers (core layer, shelling layer and oxide layer) each layer including at least one of a number of possible quantum dot materials or oxides as will be discussed further below.

The plurality of second quantum dots of the second quantum dot type may be produced by known preparation methods for quantum dots such as colloid synthesis as generally known.

The use of two different quantum dot types may improve the color gamut and the fluorescence lifetime (reduced saturation in high power applications may increase image quality).

In some embodiments, the projector color wheel further includes a diffusion film provided as a separate section on the substrate for diffusing incident light. The diffusion film may be glass-, ceramic-, metal oxide-, semiconductor oxide-, acryl- or polycarbonate-based or the like (e.g. translucent materials) for diffusing incident light, i.e. the diffusion film functions as an optical diffuser element.

In some embodiments, the first quantum dot type has a structure which includes: a first core layer including a first quantum dot material, a first shelling layer including a second quantum dot material formed on the first core layer, and a first oxide layer including a first oxide formed on the first shelling layer.

The first quantum dot material and the second quantum dot material may include at least one of cadmium selenide (CdSe), cadmium sulfide (CdS), CdTe, zinc selenide (ZnSe), ZnS, ZnTe, GaAs, GaP, GaSb, indium phosphide (InP), InAs, InSb, HgS, HgSe, HgTe, AlAs, AlP, AlSb or any combinational proportion thereof (e.g. $In_xGa_{1-x}P$, $ZnSe_xTe_{1-x}$, $ZnSe_xS_{1-x}$).

The first oxide may be a metal oxide or semiconductor oxide such as aluminum oxide ($Al_2O_3$), $SiO_2$, $TiO_2$, $ZrO_2$ or ZnO or the like or an earth alkali oxide MO, wherein the M stands for one of Mg, Ca, Sr and Ba. Moreover, the first oxide may be one of the possible binding materials which are disclosed above.

In some embodiments, the structure of the first quantum dot type (further) includes a second shelling layer of a third quantum dot material formed between the first shelling layer and the first oxide layer.

The third quantum dot material may include at least one of cadmium selenide (CdSe), cadmium sulfide (CdS), CdTe, zinc selenide (ZnSe), ZnS, ZnTe, GaAs, GaP, GaSb, indium phosphide (InP), InAs, InSb, HgS, HgSe, HgTe, AlAs, AlP, AlSb or any combinational proportion thereof (e.g. $In_xGa_{1-x}P$, $ZnSe_xTe_{1-x}$, $ZnSe_xS_{1-x}$).

In some embodiments, a first quantum dot type has a structure of a core layer including CdSe, a first shelling layer including CsS and a second shelling layer including ZnS (the first oxide may include $SiO_2$ or any other of the above-mentioned materials).

In other embodiments, a first quantum dot type has a structure of a core layer including InP, a first shelling layer including ZnSe and a second shelling layer including ZnS (the first oxide may include $SiO_2$ or any other of the above-mentioned materials).

Generally, a plurality of quantum dots of a multi-layer quantum dot type may improve, e.g., fluorescence (emission) quantum yield (i.e. the number of emitted photons per absorbed photons). The shelling layers may include a material with a larger bandgap than the core, which may reduce the access of generated electrons and holes to non-radiative surface recombination pathways. Moreover, the oxide (layer) may prevent the core and shelling layers to burn under oxygen atmosphere (e.g. in high power applications). Furthermore, the multi-layer quantum dot type may prevent self-quenching of the excited quantum dots due to an increased distance between the cores of neighboring quantum dots, whereby the wavelength-changing efficiency may be increased.

In some embodiments, the first quantum dot material is cadmium selenide and the second quantum dot material is cadmium sulfide.

In some embodiments, the first quantum dot material is indium phosphide, the second quantum dot material is zinc selenide and the third quantum dot material is zinc sulfide.

In some embodiments, the first oxide is silicon oxide or aluminum oxide.

In some embodiments, the second quantum dot type has a structure which includes: a second core layer including a fourth quantum dot material, a third shelling layer including a fifth quantum dot material formed on the second core layer, and a second oxide layer including a second oxide formed on the third shelling layer.

The fourth and the fifth quantum dot material may include at least one of cadmium selenide (CdSe), cadmium sulfide (CdS), CdTe, zinc selenide (ZnSe), ZnS, ZnTe, GaAs, GaP, GaSb, indium phosphide (InP), InAs, InSb, HgS, HgSe, HgTe, AlAs, AlP, AlSb or any combinational proportion thereof (e.g. $In_xGa_{1-x}P$, $ZnSe_xTe_{1-x}$, $ZnSe_xS_{1-x}$).

The second oxide may be a metal oxide or semiconductor oxide such as aluminum oxide ($Al_2O_3$), $SiO_2$, $TiO_2$, $ZrO_2$ or ZnO or the like or an earth alkali oxide MO, wherein the M stands for one of Mg, Ca, Sr and Ba. Moreover, the first oxide may be one of the possible binding materials which are disclosed above.

In some embodiments, the structure of the second quantum dot type (further) includes a fourth shelling layer including a sixth quantum dot material formed between the third shelling layer and the second oxide layer.

The sixth quantum dot material may include at least one of cadmium selenide (CdSe), cadmium sulfide (CdS), CdTe, zinc selenide (ZnSe), ZnS, ZnTe, GaAs, GaP, GaSb, indium phosphide (InP), InAs, InSb, HgS, HgSe, HgTe, AlAs, AlP, AlSb or any combinational proportion thereof (e.g. $In_xGa_{1-x}P$, $ZnSe_xTe_{1-x}$, $ZnSe_xS_{1-x}$).

In some embodiments, the fourth quantum dot material is cadmium selenide and the fifth quantum dot material is cadmium sulfide.

In some embodiments, the fourth quantum dot material is indium phosphide, the fifth quantum dot material is zinc selenide and the sixth quantum dot material is zinc sulfide.

In some embodiments, the second oxide is silicon oxide or aluminum oxide.

Generally, the first and second quantum dot type may have a structure with the same or of a different material composition. Hence, in some embodiments, the emission wavelength is tuned by the material composition and/or by the size or thickness of each material layer (e.g. core and protective layer(s)) of the quantum dots.

Figure 2:
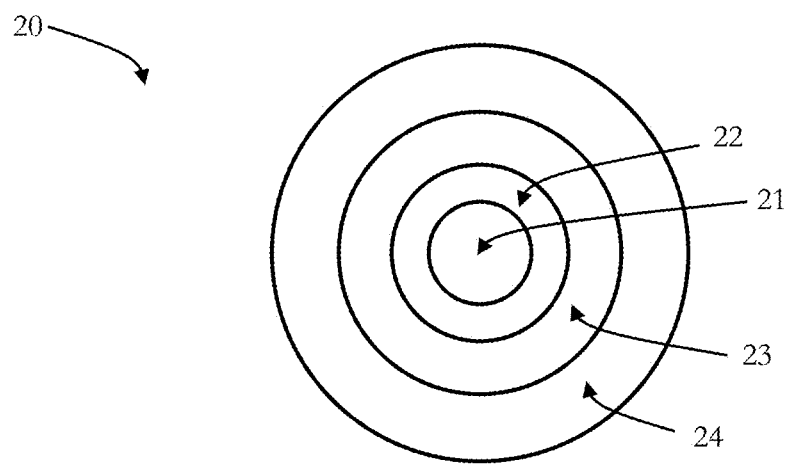
FIG. 2 schematically illustrates an embodiment of a structure of a first and a second quantum dot type.

For enhancing the general understanding of a structure of a quantum dot implemented in some embodiments of the present disclosure, in the following a general structure of a quantum dot is explained under reference of FIG. 2, which schematically illustrates an embodiment of a structure 20 of a first and second quantum dot type.

The structure 20 includes a core layer 21, a shelling layer 22, another shelling layer 23 and an oxide layer 24. The shelling layer 22 is formed on the core layer 21. The oxide layer 24 is formed on the shelling layer 22, wherein the other shelling layer 23 is formed between the shelling layer 22 and the oxide layer 24.

The core layer 21 is an example for a first and a second core layer, wherein the first core layer includes a first and the second core layer includes a fourth quantum dot material, respectively, as described herein.

The shelling layer 22 is an example for a first and a third shelling layer, wherein the first shelling layer includes a second and the third shelling layer includes a fifth quantum dot material, respectively, as described herein.

The other shelling layer 23 is an example for a second and fourth shelling layer, wherein the second shelling layer includes a third and the fourth shelling layer includes a sixth quantum dot material, respectively, as described herein.

The oxide layer 24 is an example for a first and a second oxide layer, wherein the first oxide layer includes a first and the second oxide layer includes a second oxide, respectively, as described herein.

Returning to the general explanations, in some embodiments, the projector color wheel further includes: a reflective film provided on the substrate, wherein the reflective film is arranged between the substrate and the first film or between the substrate and the second film or between the substrate and the first film and the second film.

In some embodiments, the reflective film is a metallic film, wherein the metallic film includes aluminum or silver.

The reflective film is optional. In some embodiments, the projector color wheel, including the reflective film, is used in a reflective configuration (e.g., as discussed under reference of FIG. 1A). In some embodiments, the projector color wheel, without the reflective film, is used in a transmissive configuration (e.g., as discussed under reference of FIG. 1B).

In some embodiments, the binding material is sodium silicate. In some embodiments, the sodium silicate ($Na_2SiO$), as an example of a binding material, attaches the films to each other. The sodium silicate may provide a better thermal stability than other binding materials due to the high thermal expansion coefficient. Additionally, the sodium silicate may not burn under oxygen atmosphere e.g. in high power applications.

The projector color wheel may provide:
better color gamut by using quantum dots;
better suitability for high power application due to shorter fluorescence lifetime of quantum dots compared to yellow phosphor;
a higher refraction due to higher delta n between CdSe (n=2.6) and air (n=1);
a compatibility of oxide outer layer and sodium silicate; and
a narrow diffraction cone angle of −70°.

Some embodiments pertain to a projector illumination device, including
a light source configured to emit light of at least a predetermined wavelength; and a projector color wheel, as discussed herein and as discussed above, including:
a substrate;
a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents;
a second film for changing a wavelength of light, provided on the substrate, including a second material, the second material being configured to emit light according to a second emission profile with at least a second emission peak at a second emission wavelength when light of the predetermined wavelength incidents;
wherein each of the first film and the second film includes a binding material; and
wherein the first emission wavelength is larger than the second emission wavelength.

The light source may be a light emitting diode (LED), an array of LEDs, a laser, e.g. a laser diode, or the like. The light source emits light having an optical output profile including at least a predetermined wavelength. The predetermined wavelength is smaller than the first and the second emission wavelength.

Returning to FIG. 3, a block diagram schematically illustrates a first embodiment of a projector color wheel 10a. The first embodiment of the projector color wheel 10a is discussed under reference of FIG. 1A, FIG. 3 and FIG. 4. The same reference signs as in FIG. 1A are used for components which have basically the same configuration and functionality.

The projector color wheel 10a has a substrate 30. The substrate 30 is formed of glass and has a disk-shape.

A wavelength-changing section 35a is provided on the substrate 30, wherein the wavelength-changing section 35a is provided as a ring around the substrate 30 as can be seen in FIG. 3.

The projector color wheel 10a is provided in a projector illumination device 1A of FIG. 1A, which, as discussed above, is representative for a general type of projector illumination devices which use a projector color wheel in a reflective configuration.

The projector color wheel 10a generates new colors (changes the wavelength) from the light including the (at least) predetermined wavelength emitted by the first light source 2, which incidents onto the projector color wheel 10a.

The wavelength-changing section 35a has a reflective film 31, a first film 32a and a second film 33a. The reflective film 31 is a silver film for reflecting light emitted by the first film 32a and the second film 33a.

The first film 32a and the second film 33a are provided, i.e. are arranged, on each other, wherein the second film 33a is arranged on top of the first film 32a (in other embodiments the first film 32a is arranged on top of the second film 32a as the order is basically arbitrary).

The first film 32a includes a plurality of first quantum dots 20a of a first quantum dot type.

The first quantum dot type has a structure which includes a first core layer including CdSe, a first shelling layer formed on the first core layer including CdS and a first oxide layer formed on the first shelling layer including $SiO_2$.

The second film includes cerium doped yttrium aluminum garnet 34 (Ce:YAG).

Moreover, each of the first film 32a and the second film 33a (further) includes a binding material (not shown), here sodium silicate, for attaching the films to each other.

The second film 33a is arranged on the light incident side and the substrate 30 on the other side.

Then, the light of the predetermined wavelength incident onto the projector color wheel 10a is first absorbed in the second film 33a, here the Ce:YAG 34, which decreases the optical power incident to the plurality of first quantum dots 20a in the first film 32a.

An optical output profile of the light source 2 which incidents onto the projector color wheel 10a is shown schematically in FIG. 4 as the left graph, wherein the light includes at least the predetermined wavelength of (about) 450 nm.

The Ce:YAG 34 emits light according to an emission profile, corresponding to the middle graph in FIG. 4, which has a (broad) emission peak at a second emission wavelength of (about) 550 nm. The plurality of first quantum dots 20a emits light according to an emission profile, corresponding to the right graph in FIG. 4, which has a (narrow) emission peak at a first emission wavelength of (about) 650 nm. The emission peak of the Ce:YAG 34 is broad compared to the emission peak of the plurality of first quantum dots 20a.

The emission profile of the Ce:YAG has a low value in the red part of spectrum compared to the emission peak at (about) 550 nm. This spectral region is covered by the plurality of first quantum dots 20a, since the emission profile of the plurality of first quantum dots has an emission peak in the red part of the spectrum at (about) 650 nm.

Thus, the projector color wheel 10a may provide better color gamut, more light in the red spectral region, better saturation and thermal behavior compared to known projector color wheels, which may be useful in, for example, high power laser illuminated projectors.

The emission of the Ce:YAG 34 may also excite the plurality of first quantum dots 20a to generate the red light, wherein the amount of generated heat may be reduced (excess energy is lower) as the plurality of first quantum dots 20a is excited in a lower energy state than it would be the case with blue light, thereby the lifetime of the plurality of first quantum dots 20a may be increased.

Figure 5:
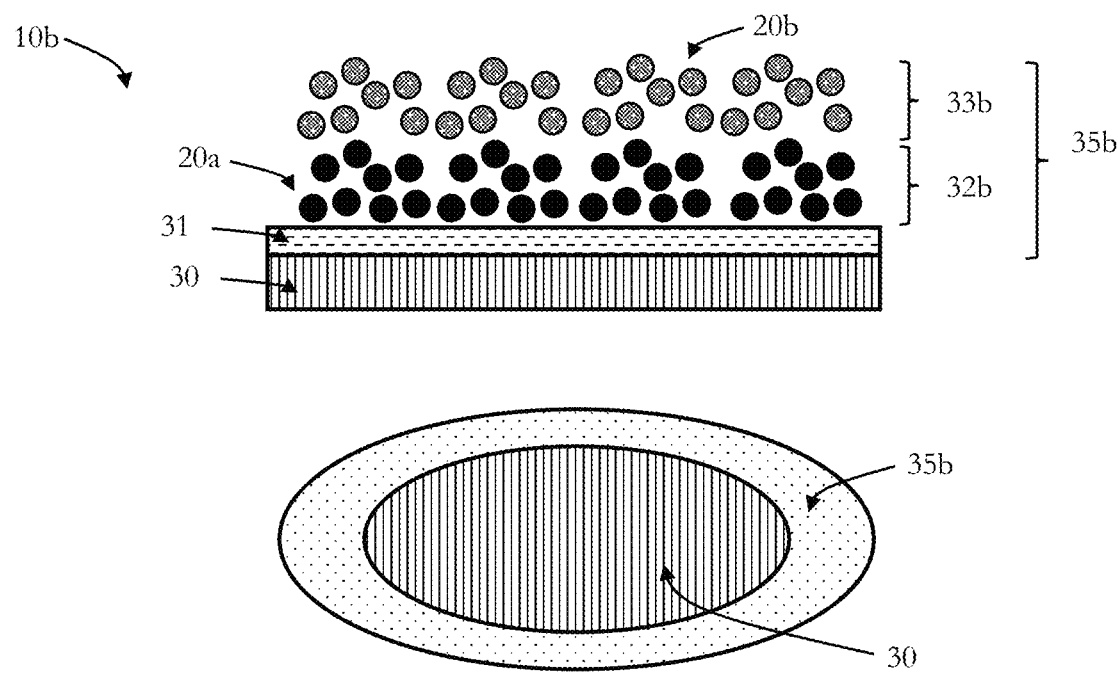
FIG. 5 schematically illustrates a second embodiment of a projector color wheel.

FIG. 5 schematically illustrates in a block diagram a second embodiment of a projector color wheel 10b. The second embodiment of the projector color wheel 10b is discussed under reference of FIG. 1A, FIG. 5 and FIG. 6. The same reference signs as in FIG. 1A and FIG. 3 are used for components which have basically the same configuration and functionality.

The projector color wheel 10b has a substrate 30. The substrate 30 is formed of glass and has a disk-shape.

A wavelength-changing section 35b is provided on the substrate 30, wherein the wavelength-changing section 35b is provided as a ring around the substrate 30 as can be seen in FIG. 5.

The projector color wheel 10b is provided in a projector illumination device 1A of FIG. 1A, which is representative for a general type of projector illumination devices which use a projector color wheel in a reflective configuration.

The projector color wheel 10b generates new colors (changes the wavelength) from the light including the (at least) predetermined wavelength emitted by the first light source 2, which incidents onto the projector color wheel 10b.

The wavelength-changing section 35b has a reflective film 31, a first film 32a and a second film 33a. The reflective film 31 is a silver film for reflecting light emitted by the first film 32b and the second film 33b.

The first film 32b and the second film 33b are provided, i.e. are arranged, on each other.

The first film 32b includes a plurality of first quantum dots 20a of a first quantum dot type and the second film 33b includes a plurality of second quantum dots 20b of a second quantum dot type, respectively.

The first quantum dot type has a structure which includes a first core layer including CdSe, a first shelling layer formed on the first core layer including CdS and a first oxide layer formed on the first shelling layer including $SiO_2$.

The second quantum dot type has a structure which includes a second core layer including InP, a third shelling layer formed on the second core layer including ZnSe, a fourth shelling layer including ZnS formed between the third shelling layer and a second oxide layer including $SiO_2$ formed on the third shelling layer.

The emission wavelength is tuned by the material composition and/or by the size or thickness of each material layer of the quantum dots such that the first emission wavelength of the plurality of first quantum dots 20a is larger than the emission wavelength of the plurality of second quantum dots 20b.

Moreover, each of the first film 32b and the second film 33b (further) includes a binding material (not shown), here sodium silicate, for attaching the films to each other.

The second film 33b is arranged on the light incident side and the substrate 30 on the other side.

Figure 6:
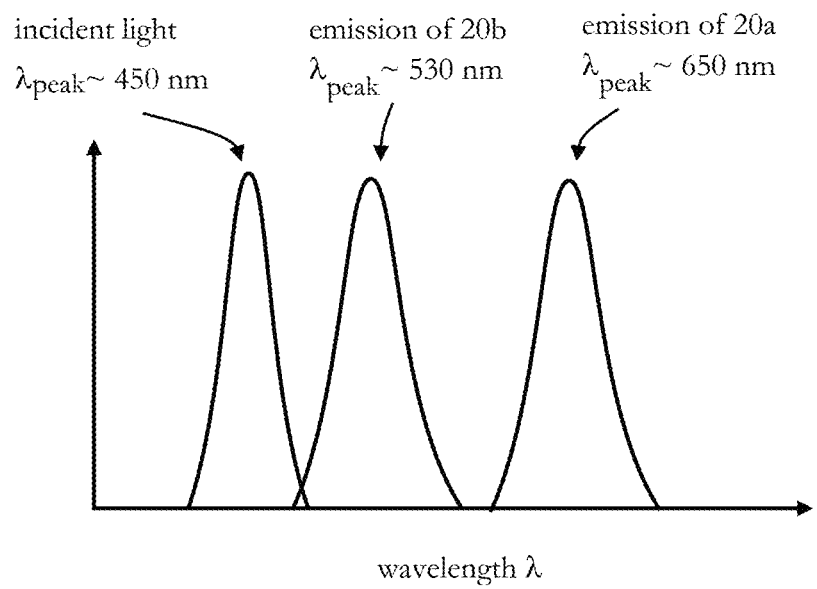
FIG. 6 schematically illustrates in a graph an embodiment of an optical output profile, a first emission profile with a first emission peak at a first emission wavelength of a first film and a second emission profile with a second emission peak at a second emission wavelength of a second film.

An optical output profile of the light source 2 which incidents onto the projector color wheel 10b is shown schematically in FIG. 6 as the left graph, wherein the light includes at least the predetermined wavelength of (about) 450 nm ("blue light").

The plurality of second quantum dots emits light according to an emission profile, corresponding to the middle graph in FIG. 6, which has a (narrow) emission peak at a second emission wavelength of (about) 530 nm ("green light"). The plurality of first quantum dots 20a emits light according to an emission profile, corresponding to the right graph in FIG. 6, which has a (narrow) emission peak at a first emission wavelength of (about) 650 nm ("red light"). The emission peak of the plurality of first and second quantum dots 20a and 20b is narrow compared to the Ce:YAG 34 in the embodiment corresponding to FIG. 3.

Thus, the provision of two films 32b and 33b for changing a wavelength of light in the projector color wheel 10b, wherein the two films 32b and 33b are based on two (different) types of quantum dots 20a and 20b, may provide better color gamut, more light in the red spectral region, better saturation and thermal behavior compared to known projector color wheels. This may be useful in, for example, high power laser illuminated projectors.

FIG. 7 schematically illustrates in a block diagram a third embodiment of a projector color wheel 10c. The third embodiment of the projector color wheel 10c is discussed under reference of FIG. 1A, FIG. 6 and FIG. 7. The same reference signs as in FIG. 1A, FIGS. 3 and 5 are used for components which have basically the same configuration and functionality.

The projector color wheel 10c has a substrate 30. The substrate 30 is formed of glass and has a disk-shape.

A first wavelength-changing section 36, a second wavelength-changing section 37 and a diffusive film 38 are provided as separate sections on the substrate 30, wherein the separate sections 36, 37 and 38 are arranged as a ring around the substrate 30 as can be seen in FIG. 6.

The diffuse film 38 is an optical diffuser element for diffusing incident light, wherein the diffusive film 38 is of glass.

The wavelength-changing section 36 has a first film 32c and the wavelength-changing section 37 has a second film 33c, respectively.

The projector color wheel 10c has a reflective film 31, wherein the reflective film 31 is a silver film for reflecting light. The reflective film 31 is provided on the substrate 30 in each of the sections 36, 37 and 38.

The projector color wheel 10c is provided in a projector illumination device 1A of FIG. 1A, which is representative for a general type of projector illumination devices which use a projector color wheel in a reflective configuration.

The projector color wheel 10c generates new colors (changes the wavelength) from the light including (at least) the predetermined wavelength, which incidents onto the projector color wheel 10c.

The first film 32c includes a plurality of first quantum dots 20a of a first quantum dot type and the second film 33c includes a plurality of second quantum dots 20b of a second quantum dot type, respectively.

The first quantum dot type 20a has a structure which includes a first core layer including CdSe, a first shelling layer formed on the first core layer including CdS and a first oxide layer formed on the first shelling layer including $SiO_2$.

The second quantum dot type 20b includes a second core layer including InP, a third shelling layer formed on the second core layer including ZnSe, a fourth shelling layer including ZnS formed between the third shelling layer and a second oxide layer including $SiO_2$ formed on the third shelling layer.

The emission wavelength is tuned by the material composition and/or by the size or thickness of each material layer of the quantum dots such that the first emission wavelength of the plurality of first quantum dots 20a is larger than the emission wavelength of the plurality of second quantum dots 20b.

Moreover, each of the first film 32c and the second film 33c (further) includes a binding material (not shown), here sodium silicate, for attaching the films (on the separate sections 36 and 37) to each other.

The sections 36, 37 and 38 are arranged on the light incident side and the substrate 30 on the other side.

An optical output profile of the light source 2 which incidents onto the projector color wheel 10c is shown schematically in FIG. 6 as the left graph, wherein the light includes at least the predetermined wavelength of (about) 450 nm ("blue light").

The plurality of second quantum dots emits light according to an emission profile, corresponding to the middle graph in FIG. 6, which has a (narrow) emission peak at a second emission wavelength of (about) 530 nm ("green light"). The plurality of first quantum dots 20a emits light according to an emission profile, corresponding to the right graph in FIG. 6, which has a (narrow) emission peak at a first emission wavelength of (about) 650 nm ("red light"). The emission peak of the plurality of first and second quantum dots 20a and 20b is narrow compared to the Ce:YAG 34 in the embodiment corresponding to FIG. 3.

Thus, the provision of two films 32c and 33c for changing a wavelength of light in the projector color wheel 10c, wherein the two films 32c and 33c are based on two (different) types of quantum dots 20a and 20b, may provide better color gamut, more light in the red spectral region, better saturation and thermal behavior compared to known projector color wheels. This may be useful in, for example, high power laser illuminated projectors.

This embodiment provides a (rotatable) projector color wheel 10c which can be used (in principle) in reflection and transmission and includes separate sections for the "blue light" (diffusion film 38, which diffuses the light incident including (at least) the predetermined wavelength), the "green light" (plurality of second quantum dots 20b) and the "red light" (plurality of first quantum dots 20a).

FIG. 8 schematically illustrates in a flow diagram a method 100 of manufacturing of a projector color wheel, including:

At 101, providing a first film for changing a wavelength of light on a substrate, including a first material including a plurality of first quantum dots of a first quantum dot type, the plurality of first quantum dots being configured to emit light according to a first emission profile with at least a first emission peak at a first emission wavelength when light of a predetermined wavelength incidents, as described herein.

The first film may be provided by known methods such as screen printing or material deposition techniques. The plurality of first quantum dots may be provided by known methods such as colloidal synthesis.

At 102, providing a second film for changing a wavelength of light on the substrate, including a second material, the second material being configured to emit light according to a second emission profile with at least a second emission peak at a second emission wavelength when light of the predetermined wavelength incidents, as described herein.

The second film may be provided by known methods such as screen printing or material deposition techniques. The second material may be provided by known methods such as colloidal synthesis in a case of quantum dots.

Note that the present technology can also be configured as described below.

(1) A projector color wheel, including:
a substrate;
a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents;
a second film for changing a wavelength of light, provided on the substrate, including a second material, the second material being configured to emit light according to a second emission profile with at least a second emission peak at a second emission wavelength when light of the predetermined wavelength incidents;
wherein each of the first film and the second film includes a binding material; and
wherein the first emission wavelength is larger than the second emission wavelength.

(2) The projector color wheel of (1), wherein the first and the second film are arranged on each other on the substrate.

(3) The projector color wheel of (1), wherein the first and the second film are provided as separate sections on the substrate.

(4) The projector color wheel of anyone of (1) to (3), wherein the second material includes cerium doped yttrium aluminum garnet.

(5) The projector color wheel of anyone of (1) to (3), wherein the second material includes a plurality of second quantum dots of a second quantum dot type.

(6) The projector color wheel of anyone of (2) to (5), further comprising:
a diffusion film provided as a separate section on the substrate for diffusing incident light.

(7) The projector color wheel of anyone of (1) to (6), wherein the first quantum dot type has a structure which includes:
a first core layer including a first quantum dot material;
a first shelling layer including a second quantum dot material formed on the first core layer; and
a first oxide layer including a first oxide formed on the first shelling layer.

(8) The projector color wheel of (7), wherein the structure of the first quantum dot type includes:
a second shelling layer including a third quantum dot material formed between the first shelling layer and the first oxide layer.

(9) The projector color wheel of (7) or (8), wherein the first quantum dot material is cadmium selenide and the second quantum dot material is cadmium sulfide.

(10) The projector color wheel of (8), wherein the first quantum dot material is indium phosphide, the second quantum dot material is zinc selenide and the third quantum dot material is zinc sulfide.

(11) The projector color wheel of anyone of (7) to (10), wherein the first oxide is silicon oxide or aluminum oxide.

(12) The projector color wheel of anyone of (5) to (11), wherein the second quantum dot type has a structure which includes:
a second core layer including a fourth quantum dot material;
a third shelling layer including a fifth quantum dot material formed on the second core layer; and
a second oxide layer including a second oxide formed on the third shelling layer.

(13) The projector color wheel of (12), wherein the structure of the second quantum dot type includes:
a fourth shelling layer including a sixth quantum dot material formed between the third shelling layer and the second oxide layer.

(14) The projector color wheel of (12), wherein the fourth quantum dot material is cadmium selenide and the fifth quantum dot material is cadmium sulfide.

(15) The projector color wheel of (13), wherein the fourth quantum dot material is indium phosphide, the fifth quantum dot material is zinc selenide and the sixth quantum dot material is zinc sulfide.

(16) The projector color wheel of anyone of (12) to (15), wherein the second oxide is silicon oxide or aluminum oxide.

(17) The projector color wheel of anyone of (1) to (16), further comprising:
a reflective film provided on the substrate, wherein the reflective film is arranged between the substrate and the first film or between the substrate and the second film or between the substrate and the first film and the second film.

(18) The projector color wheel of (17), wherein the reflective film is a metallic film, wherein the metallic film includes aluminum or silver.

(19) The projector color wheel of anyone of (1) to (18), wherein the binding material is sodium silicate.

(20) A projector illumination device, including:
a light source configured to emit light of at least a predetermined wavelength; and a projector color wheel, including:
- a substrate;
- a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength incidents;
- a second film for changing a wavelength of light, provided on the substrate, including a second material, the second material being configured to emit light according to a second emission profile with at least a second emission peak at a second emission wavelength when light of the predetermined wavelength incidents;
- wherein each of the first film and the second film includes a binding material; and
- wherein the first emission wavelength is larger than the second emission wavelength.

(21) A method of manufacturing a projector color wheel, including:
- providing a first film for changing a wavelength of light on a substrate, including a first material including a plurality of first quantum dots of a first quantum dot type, the plurality of first quantum dots being configured to emit light according to a first emission profile with at least a first emission peak at a first emission wavelength when light of a predetermined wavelength incidents; and
- providing a second film for changing a wavelength of light on the substrate, including a second material, the second material being configured to emit light according to a second emission profile with at least a second emission peak at a second emission wavelength when light of the predetermined wavelength incidents.

The invention claimed is:

1. A wavelength conversion member, comprising:
a substrate;
a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength is incident thereon; and
a second film for changing a wavelength of light, provided on the substrate, including a second material, the second material being configured to emit light according to a second emission profile with at least a second emission peak at a second emission wavelength when light of the predetermined wavelength is incident thereon;
wherein the first emission wavelength is larger than the second emission wavelength and a first emission peak of the first emission wavelength is narrower than a second emission peak of the second emission wavelength.

2. The wavelength conversion member according to claim 1, wherein the first and the second film are arranged on each other on the substrate such that light is incident on the second film before being incident on the first film.

3. The wavelength conversion member according to claim 1, wherein the first and the second film are provided as separate sections on the substrate in a plane with respect to incident light.

4. The wavelength conversion member according to claim 1, wherein the second material includes cerium doped yttrium aluminum garnet.

5. The wavelength conversion member according to claim 1, wherein the second material includes a plurality of second quantum dots of a second quantum dot type.

6. The wavelength conversion member according to claim 3, further comprising:
a diffusion film provided as a separate section on the substrate for diffusing incident light in the plane with respect to incident light.

7. The wavelength conversion member according to claim 1, wherein the first quantum dot type has a structure which includes:
a first core layer including a first quantum dot material;
a first shelling layer including a second quantum dot material formed on the first core layer; and
a first oxide layer including a first oxide formed on the first shelling layer.

8. The wavelength conversion member according to claim 7, wherein the structure of the first quantum dot type includes:
a second shelling layer including a third quantum dot material formed between the first shelling layer and the first oxide layer.

9. The wavelength conversion member according to claim 7, wherein the first quantum dot material is cadmium selenide and the second quantum dot material is cadmium sulfide.

10. The wavelength conversion member according to claim 8, wherein the first quantum dot material is indium phosphide, the second quantum dot material is zinc selenide and the third quantum dot material is zinc sulfide.

11. The wavelength conversion member according to claim 7, wherein the first oxide is silicon oxide or aluminum oxide.

12. The wavelength conversion member according to claim 5, wherein the second quantum dot type has a structure which includes:
a second core layer including a fourth quantum dot material;
a third shelling layer including a fifth quantum dot material formed on the second core layer; and
a second oxide layer including a second oxide formed on the third shelling layer.

13. The wavelength conversion member according to claim 12, wherein the structure of the second quantum dot type includes:
a fourth shelling layer including a sixth quantum dot material formed between the third shelling layer and the second oxide layer.

14. The wavelength conversion member according to claim 12, wherein the fourth quantum dot material is cadmium selenide and the fifth quantum dot material is cadmium sulfide.

15. The wavelength conversion member according to claim 13, wherein the fourth quantum dot material is indium phosphide, the fifth quantum dot material is zinc selenide and the sixth quantum dot material is zinc sulfide.

16. The wavelength conversion member according to claim 12, wherein the second oxide is silicon oxide or aluminum oxide.

17. The wavelength conversion member according to claim 1, further comprising:
a reflective film provided on the substrate, wherein the reflective film is arranged between the substrate and the first film or between the substrate and the second film or between the substrate and the first film and the second film.

18. The wavelength conversion member according to claim 17, wherein the reflective film is a metallic film, wherein the metallic film includes aluminum or silver.

19. The wavelength conversion member according to claim 1, wherein each of the first film and the second film includes a binding material.

20. A illumination device, comprising:
   a light source configured to emit light of at least a predetermined wavelength; and
   a wavelength conversion member, including:
      a substrate;
      a first film for changing a wavelength of light, provided on the substrate, including a first material including a plurality of first quantum dots of a first quantum dot type, the plurality of first quantum dots being configured to emit light according to a first emission profile with at least a first emission peak at a first emission wavelength when light of a predetermined wavelength is incident thereon;
      a second film for changing a wavelength of light, provided on the substrate, including a second material, the second material being configured to emit light according to a second emission profile with at least a second emission peak at a second emission wavelength when light of the predetermined wavelength is incident thereon;
   wherein the first emission wavelength is larger than the second emission wavelength and a first emission peak of the first emission wavelength is narrower than a second emission peak of the second emission wavelength.

* * * * *